United States Patent
Hinohara

Patent Number: 5,784,295
Date of Patent: Jul. 21, 1998

[54] METHOD AND APPARATUS FOR DETERMINING RESIDUAL BATTERY VOLTAGE

[75] Inventor: Makoto Hinohara, Tokyo, Japan

[73] Assignee: Canon Kabushiki Kaisha, Tokyo, Japan

[21] Appl. No.: 437,524

[22] Filed: May 9, 1995

Related U.S. Application Data

[63] Continuation of Ser. No. 72,094, Jun. 7, 1993, abandoned.

[30] Foreign Application Priority Data

Jun. 12, 1992 [JP] Japan .................. 4-153522

[51] Int. Cl.$^6$ .................................................. G06F 17/00
[52] U.S. Cl. .................. 364/550; 340/636; 364/481; 364/483
[58] Field of Search .................. 340/636; 364/480, 364/481, 483, 550, 551.01; 324/427

[56] References Cited

U.S. PATENT DOCUMENTS

| | | | |
|---|---|---|---|
| 5,032,825 | 7/1991 | Kuznicki | 340/636 |
| 5,105,180 | 4/1992 | Yamada et al. | 340/636 |
| 5,321,627 | 6/1994 | Reher | 364/483 |
| 5,325,041 | 6/1994 | Briggs | 340/636 X |
| 5,341,084 | 8/1994 | Gotoh et al. | 340/636 X |
| 5,352,968 | 10/1994 | Reni et al. | 320/136 |
| 5,369,364 | 11/1994 | Reniere et al. | 340/636 X |
| 5,434,508 | 7/1995 | Ishida | 340/636 X |
| 5,454,710 | 10/1995 | Landau et al. | 324/427 X |
| 5,483,165 | 1/1996 | Cameron et al. | 324/427 |
| 5,506,572 | 4/1996 | Hills et al. | 340/636 |

Primary Examiner—Edward R. Cosimano
Attorney, Agent, or Firm—Fitzpatrick, Cella, Harper & Scinto

[57] ABSTRACT

A portable electronic apparatus utilizes battery characteristics to detect the operating condition of the battery supplying power to the apparatus. Battery voltage is detected in different operating states of the apparatus and the residual battery voltage is determined on the basis of the detected different state battery voltage.

24 Claims, 8 Drawing Sheets

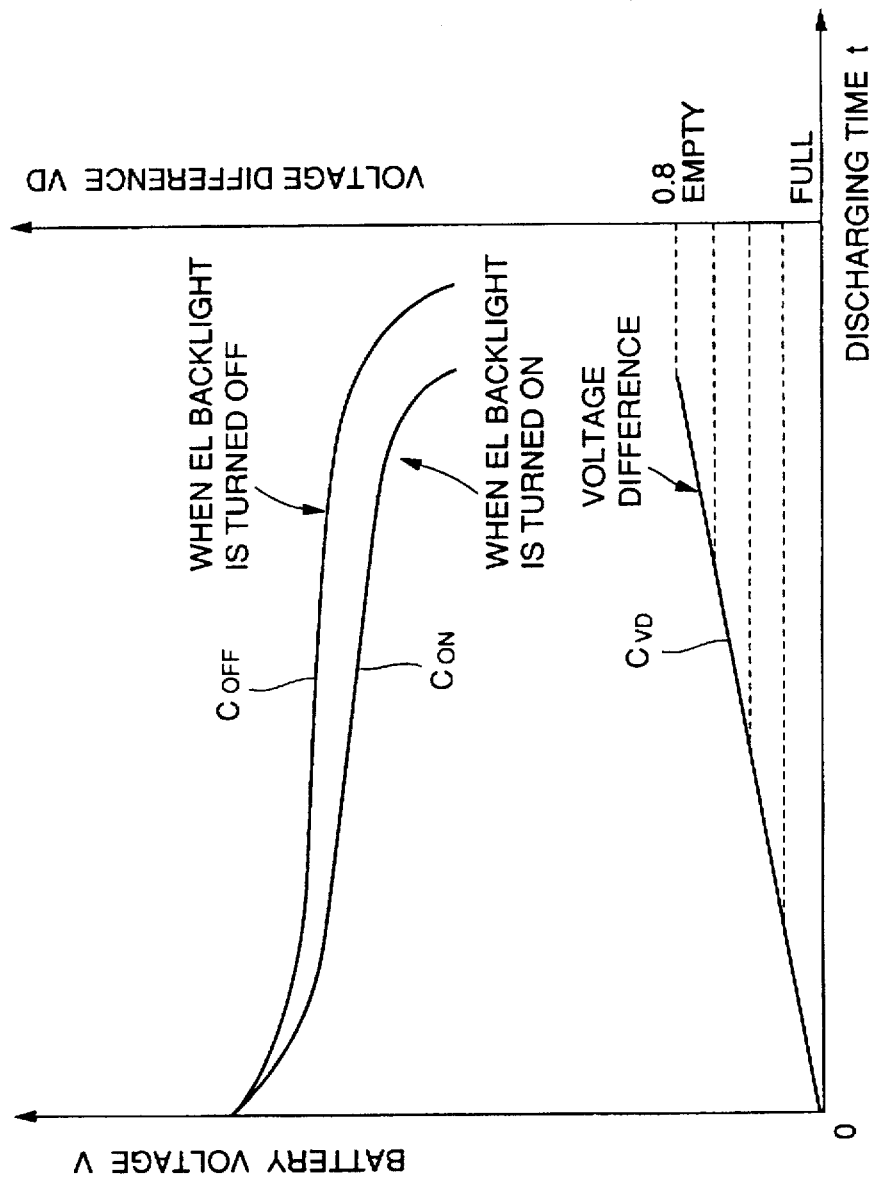

| | INDICATED RESIDUAL AMOUNT | VOLTAGE DIFFERENCE (VD) | DISPLAY DATA (HEXADECIMAL VALUE) |
|---|---|---|---|
| FIG. 5(A) | | 0.61 ~ 0.8 V | 11 |
| FIG. 5(B) | | 0.41 ~ 0.6 V | 10 |
| FIG. 5(C) | | 0.21 ~ 0.4 V | 01 |
| FIG. 5(D) | | 0 ~ 0.2 V | 00 |

METHOD AND APPARATUS FOR DETERMINING RESIDUAL BATTERY VOLTAGE

This application is a continuation of application Ser. No. 08/072,094, filed Jun. 7, 1993, now abandoned.

BACKGROUND OF THE INVENTION

1. Field of the Invention

The present invention relates to portable electronic apparatus, and more particularly, to portable electronic apparatus whose main power source is a battery and is capable of detecting and displaying the residual voltage of the main power source battery with changes according to power consumption.

2. Description of the Related Art

The above-described type of portable electronic apparatus may stop functioning during use, unless the user recognizes zero residual voltage of a battery used as the main power source and replaces the used battery with a new one. Therefore, such portable electronic apparatus generally has an arrangement for displaying the residual voltage. A chargeable nickel-cadmium battery is extensively used as the battery. The nickel-cadmium battery has discharge characteristics shown in FIG. 8. That is, the voltage which decreases in a broader sense as the discharging time passes remains substantially at a fixed value for example, about 1.2 volts during discharge.

Thus, in the conventional electronic apparatus of the above-described type, the residual battery voltage is detected and displayed by detecting the battery voltage on the basis of the discharge characteristics of the battery by a built-in A/D converter in the form of a digital value and by displaying the residual voltage on a display portion using the detected digital value. Alternatively, the residual battery voltage is detected and displayed by the structure shown in FIG. 9. In FIG. 9, reference numeral 1017 denotes a portion associated with the residual battery voltage detection in a portable electronic apparatus. Reference numeral 1011 denotes a battery mounted on the electronic apparatus as a main power source. The portion 1017 includes a residual battery voltage detecting resistor 1012 (a residual voltage integrating resistor) provided in a load circuit to send a terminal voltage which changes in response to a load to an operational amplifier 1013, an A/D converter 1014 for converting an analog value amplified by the operational amplifier 1013 into a digital value, a central processing unit (CPU) 1015 having storage means (not shown), and a liquid crystal display portion 1016 capable of displaying the residual battery voltage.

In the thus-arranged residual battery voltage detection arrangement for the electronic apparatus, the terminal voltage of the residual voltage integrating resistor 1012, which changes in response to the magnitude of the load current consumed by the functioning portion, such as the CPU 1015, the liquid crystal display portion 1016 or the printer portion in the case of an electronic apparatus which includes a printer portion, is supplied through the operational amplifier 1013 to the A/D converter 1014. The converted digital signal is sent to and integrated by the CPU 1015. The initial capacity of the battery 1011 has been stored in the CPU 1015 beforehand. Thus, the CPU 1015 calculates the residual battery voltage by subtracting the integrated capacity from the initial capacity, and displays the calculated residual voltage in the liquid crystal display portion 1016.

However, in the conventional arrangement in which the battery voltage is detected directly by the A/D converter on the basis of the battery discharge characteristics and the digital value of the detected voltage is displayed in a display portion, even when the battery voltage is relatively stable, as in the case of the nickel-cadmium battery, the voltage changes due to a change in ambient temperature or load variations, making detection erroneous or inaccurate.

In the conventional arrangement shown in FIG. 9, the residual voltage integrating resistor 1012 and the operational amplifier 1013 are necessary. This makes it difficult to provide a small portable electronic apparatus which has been demanded recently.

SUMMARY OF THE INVENTION

In view of the aforementioned problems of the prior art, an object of the present invention is to provide a portable electronic apparatus capable of detecting a residual battery voltage without requiring special hardware utilizing the characteristics of a battery, i.e., by detecting the residual battery voltage by obtaining a difference between the voltages in different operating states of a functioning unit.

According to one aspect of the invention, there is provided electronic apparatus having a unit operated by a battery, which includes a voltage detection element for detecting a voltage of the battery, and an element for determining a residual amount of the battery voltage on the basis of the battery voltages detected by the voltage detection element in different states of the unit.

According to another aspect of the present invention, there is provided electronic apparatus having a unit operated by a battery, which includes a voltage detection element for detecting a voltage of the battery, a determination element for determining a battery voltage difference on the basis of the battery voltages detected by the voltage detection element in different states of the unit, and an information element for outputting a residual amount of the battery on the basis of determination of the determination element.

According to yet another aspect of the present invention, there is provided a method of detecting a residual amount of a battery in an electronic apparatus having a unit operated by the battery, in which a battery voltage is detected in different states of the unit, and the residual amount of the battery voltage is determined on the basis of the detected battery voltages.

According to yet another aspect of the present invention, there is provided a method of detecting a residual amount of a battery in an electronic apparatus having a unit operated by the battery, in which a battery voltage is detected in a first state of the unit, the detected first state battery voltage is stored, the battery voltage in a second state of the unit is detected, the second state battery voltage is stored, and the residual amount of the battery voltage is determined on the basis of the stored first and second state battery voltages.

According to yet another aspect of the present invention, there is provided a method of detecting a residual amount of a battery in an electronic apparatus having a unit operated by the battery, in which the unit is placed in a first state, a battery voltage in the first state of the unit is detected, the unit is placed in a second state, the battery voltage in the second state of the unit is detected, and the residual amount of the battery voltage is determined on the basis of the detected first and second state battery voltages.

According to yet another aspect of the present invention, there is provided electronic apparatus having a unit operated by a battery, which includes a manually operating element used to detect a residual amount of the battery, a voltage detecting element for detecting a voltage of the battery in response to an operation of the manual operation element, and an element for determining the residual amount of the battery voltage on the basis of the battery voltages detected by the voltage detection element in different states of the unit.

According to yet another aspect of the present invention, there is provided electronic apparatus having a unit operated by a battery, which includes a manually operated switch used to detect a residual amount of the battery, a voltage detecting element for detecting a voltage of the battery in response to an operation of the manual operated switch, an operating circuit for operating the residual amount of the battery voltage on the basis of the battery voltages detected by the voltage detection means in different states of the unit, and a display device for displaying the result of operation of the operating circuit.

BRIEF DESCRIPTION OF THE DRAWINGS

FIG. 4 is a graph showing the battery discharge characteristics when an electro luminescent (EL) backlight is turned on and off;

FIGS. 5(A), 5(B), 5(C) and 5(D) show residual amount display examples (A) through (D) displayed by a liquid crystal display device according to the present invention;

DETAILED DESCRIPTION OF THE PREFERRED EMBODIMENTS

An embodiment of the present invention will be described below with reference to the accompanying drawings.

Figure 1:
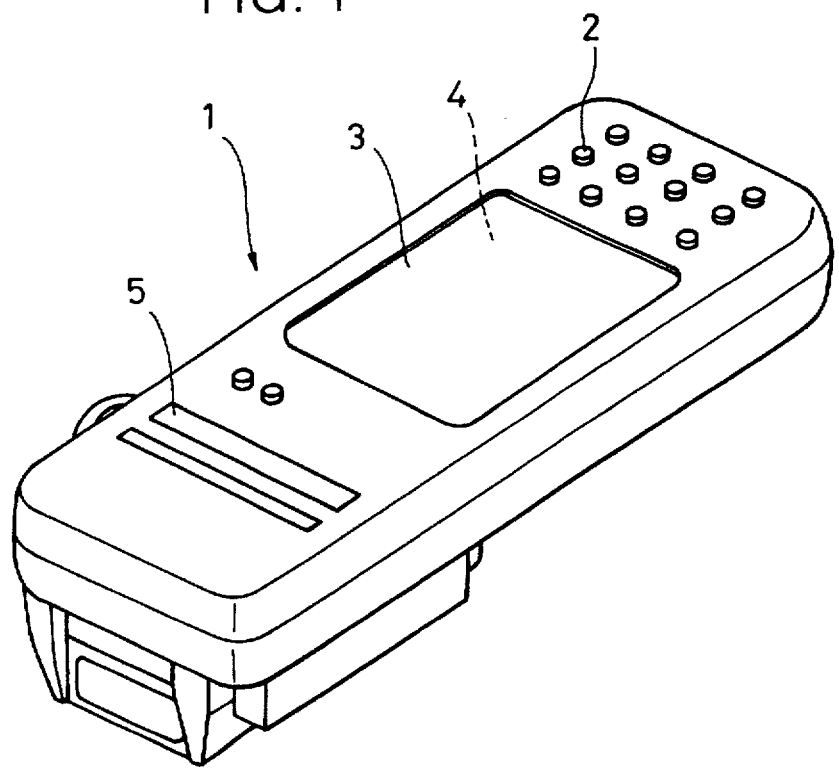
FIG. 1 shows an external view of an embodiment of the present invention.
Figure 2:
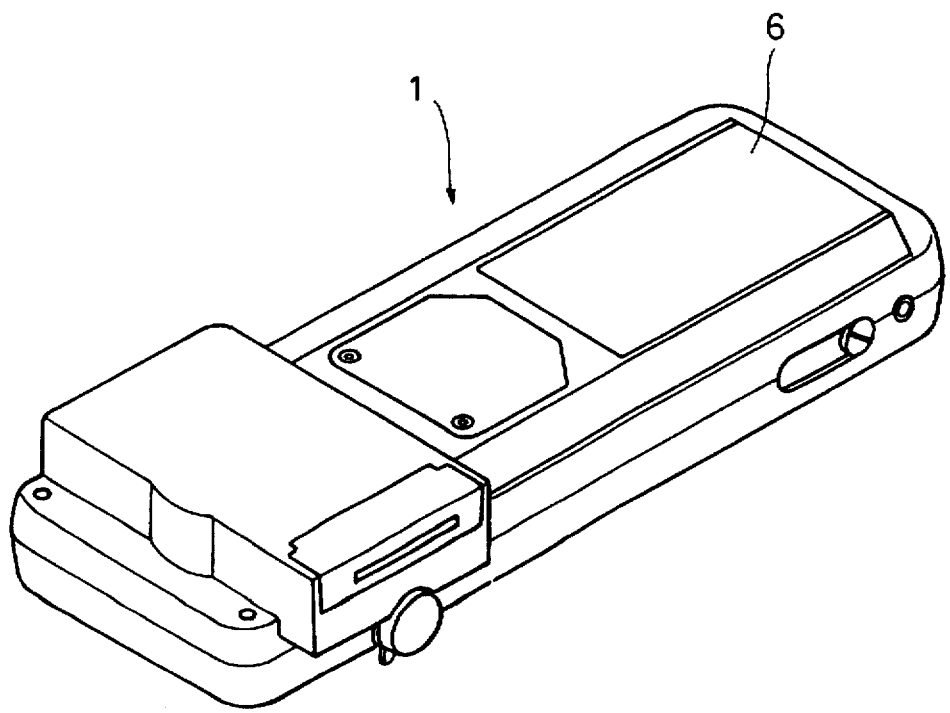
FIG. 2 is a perspective view of a portable electronic apparatus shown in FIG. 1 from a rear surface thereof.

FIG. 1 is a view of an apparatus body as seen from the front surface thereof, and FIG. 2 is a view as seen from the rear surface thereof. In these figures, reference numeral 1 denotes a portable electronic apparatus body; 2 denotes an input key used to input data or the like to the apparatus body 1; and 3 denotes a liquid crystal display portion for displaying the input data or information or the results of the processing performed in the apparatus body 1 on the basis of the input data or information. In this embodiment, the liquid crystal display portion can also display the data on the residual battery voltage detected in the apparatus body 1 in the manner described later.

Reference numeral 4 denotes an EL (electroluminescence) backlight; and 5 denotes a printer portion, such as a thermal printer, for printing the data or information input to the apparatus body or the data processed in the apparatus. On the rear surface side of the apparatus body 1 a battery accommodating portion 6 is provided, as shown in FIG. 2, and a battery for the apparatus body, e.g., a chargeable nickel-cadmium (not shown), is accommodated in the battery accommodating portion 6. The open circuit voltage of the nickel-cadmium battery is about 1.2 volts. In this embodiment, five nickel-cadmium batteries are accommodated in a series-connected state. Although the nominal voltage of the five nickel cadmium batteries is 6 volts, the usable final discharge voltage is about 5.0 volts.

Figure 3:
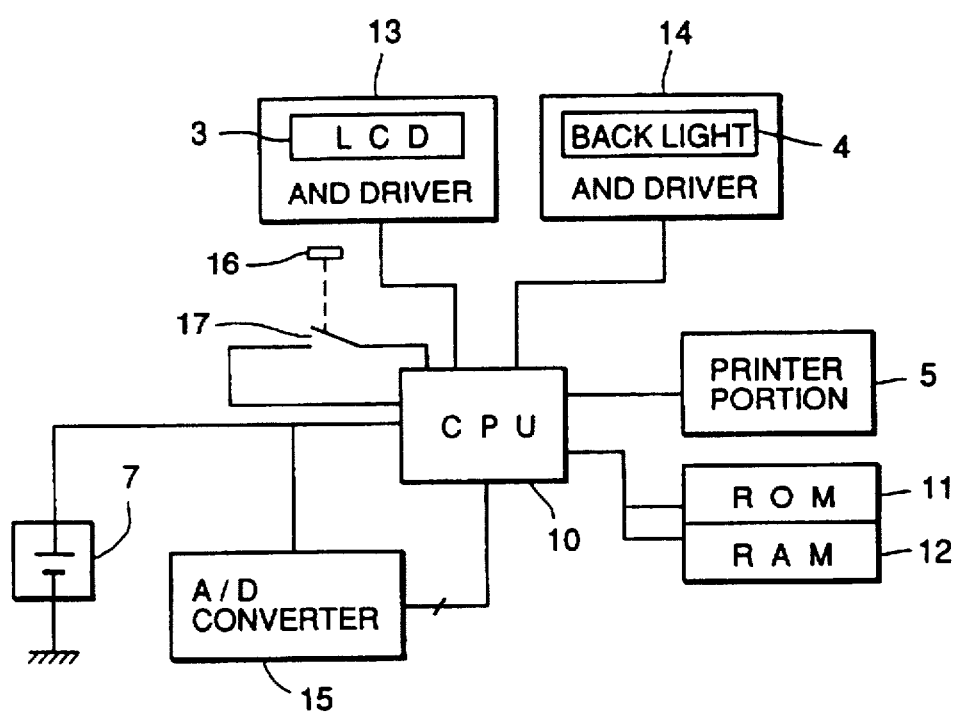
FIG. 3 is a block diagram showing the structure of electronic parts according to the present invention.

FIG. 3 is a block diagram showing the structure of electronic parts according to the present invention. In FIG. 3, reference numeral 7 denotes a nickel-cadmium battery (hereinafter referred to as a battery) accommodated in the battery accommodating portion 6 in a series-connected state; 10 denotes a central processing unit; 11 denotes a ROM; 12 denotes a RAM for storing the battery voltage and voltage difference; 13 denotes a liquid crystal display portion with a driver which displays data and the residual battery voltage; 14 denotes a backlight with a driver; 15 denotes an A/D converter provided to detect the residual voltage of the battery 7; The A/D converter has an 8-bit data handling function which allows the voltage of the battery 7 to be read and sent to the CPU 10 as a digital signal. The battery 7 supplies power to the above-mentioned components. The ROM 11 stores the program for detecting the residual battery voltage, which will be described later, various programs executed through the CPU 10 and the data required to display the detected residual voltage in the liquid crystal display portion 3.

The residual battery voltage detecting operation of this embodiment will be described below in detail.

FIG. 4 are characteristic curves showing the battery discharge characteristics and the voltage dropping condition obtained when the EL backlight 4 is turned on as well as those obtained when the EL backlight 4 is turned off. In this embodiment, the power consumption when the EL is turned on is 500 mA, and the power consumption when the EL is turned off is 350 mA. The voltage when the EL is turned on is lower than the voltage when the EL is turned off, as shown in FIG. 4. More specifically, $C_{OFF}$ shows the discharging characteristics when the EL backlight is turned off. $C_{ON}$ indicates the discharge characteristics when the EL backlight is turned on. $C_{VD}$ indicates the difference in the voltages obtained during discharge in both states.

Figure 6:
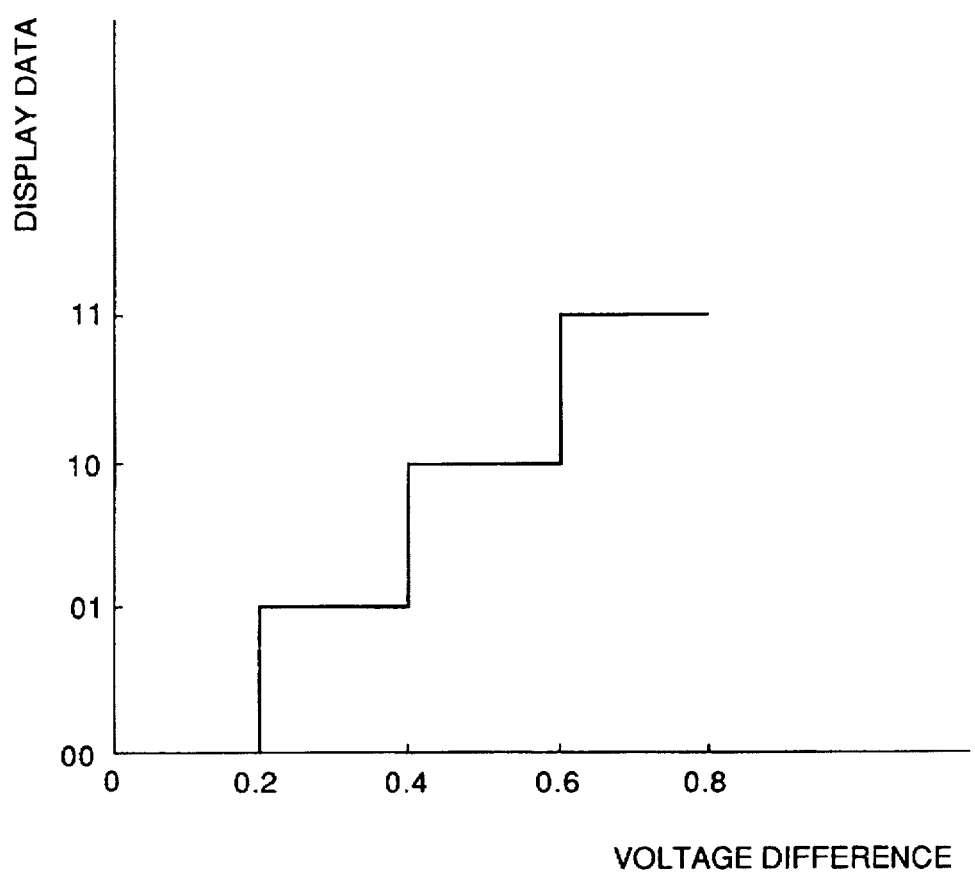
FIG. 6 shows the relation between a voltage difference and display data according to the present invention.

CVD indicates the voltage difference which increases linearly as a discharging time t elapses. Hence, the region defined by the maximum value indicating the need for exchange of the battery and the minimum value 0 indicating full charge obtained immediately after charging is divided into four portions, as shown in FIG. 4. These divided portions are stored in the ROM 11 in the form of 2-bit data used to display the residual battery voltage. The maximum voltage difference between the state when the EL backlight 2 is turned on and the state when the EL backlight 2 is turned off is 0.8 volts in this embodiment. Thus, 00H (H indicates the hexadecimal value) is stored for the region ranging from 0 to 0.2 volt, 01H is stored for the region ranging from 0.21 to 0.4 volt, 10H is stored for the region ranging from 0.41 to 0.6 volt, and 11H is stored for the region ranging from 0.61 to 0.8 volt. FIGS. 5A through 5D show the relation between the display data, the range of the battery voltage difference VD obtained in the manner described above and the residual voltage indicating mark which is actually displayed in the liquid crystal display portion 3 on the basis of the display data and the voltage difference VD. In FIG. 5(A) the display made when the residual voltage is close to 0 is indicated. FIGS. 5 (B), (C), (D) are the displays which are exhibited when the voltage levels are higher than that indicated by FIGS. 5(A). FIG. 5(D) indicates the display made immediately after charging. FIG. 6 is a graphic representation of the relation between the display data and the voltage difference VD.

Figure 7:
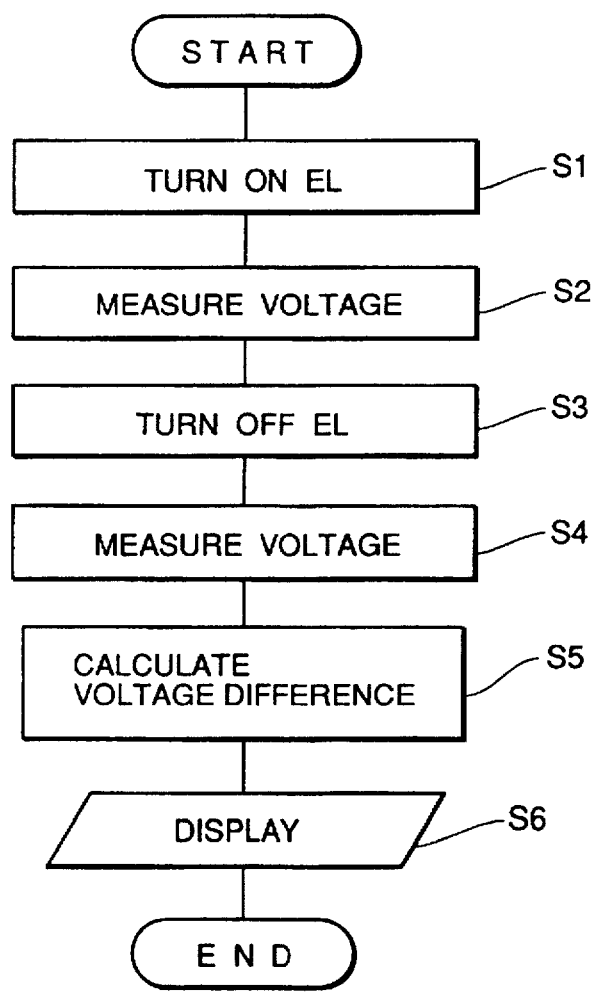
FIG. 7 is a flowchart showing the residual amount detecting sequence executed according to the embodiment of the present invention.
Figure 8:
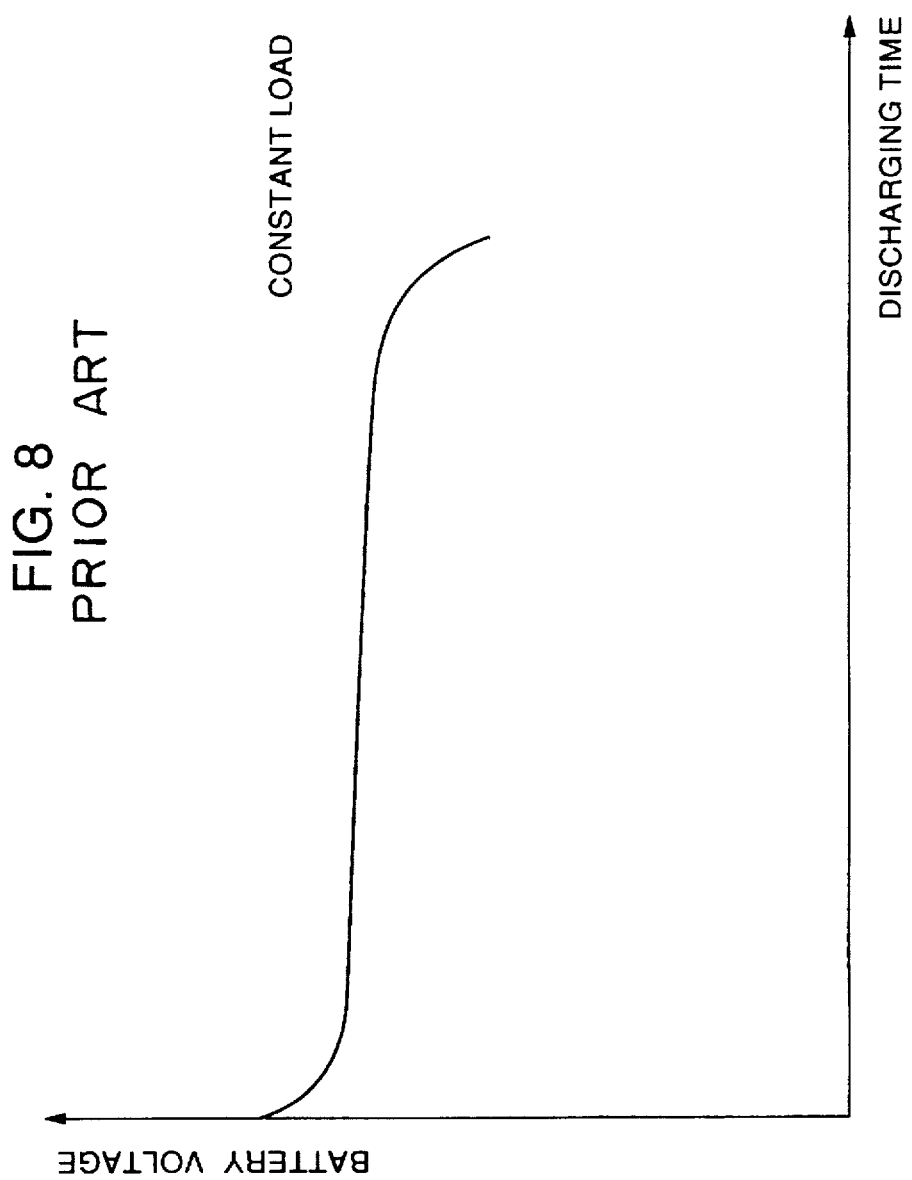
FIG. 8 shows the discharge characteristics of a standard nickel-cadmium battery.
Figure 9:
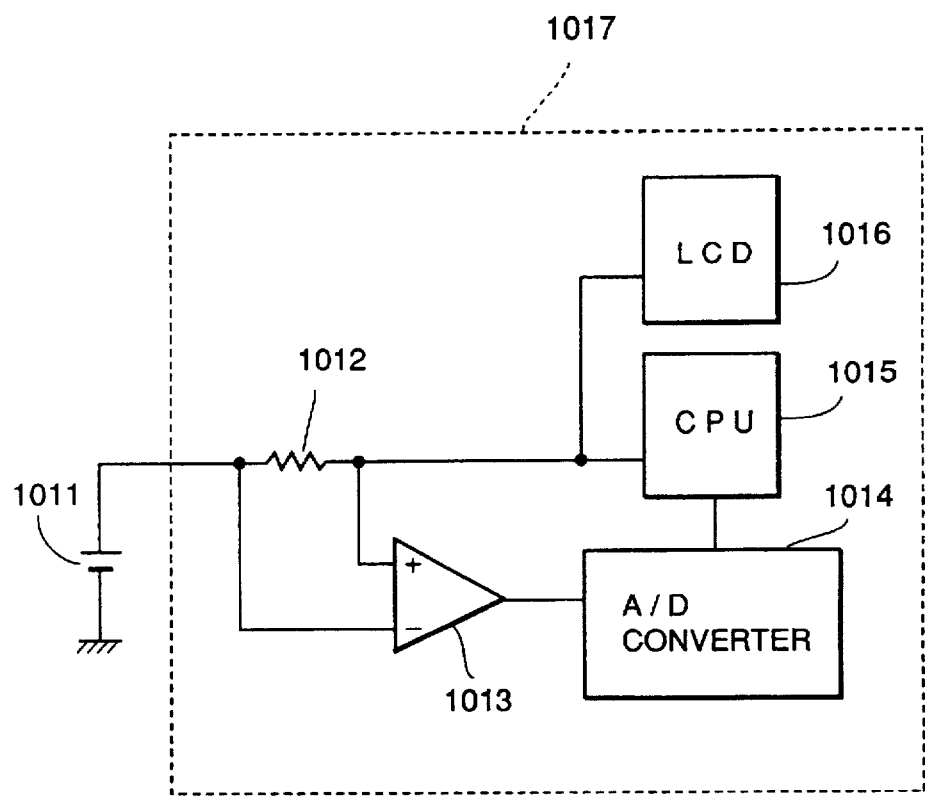
FIG. 9 is a block diagram showing the structure of a conventional residual amount detecting circuit.

The procedures of the residual battery voltage detecting operation will be described below with reference to FIG. 7.

When the user gives an instruction for residual battery voltage detection to the CPU 10 through the input means, such as a detection button, the CPU 10 turns on the EL backlight 4 in step S1. The CPU 10 detects the battery voltage obtained at that time through the A/D converter 15 in step S2, and stores the detected data in RAM 12. Next, in step S3, the CPU 10 turns off the EL backlight 4. Similarly, the CPU 10 detects the battery voltage through the A/D converter 15 in step S4, and stores the detected data in RAM 12. In step S5, the difference between the voltage detected when the EL backlight 4 is turned off and the voltage detected when the EL backlight 4 is turned on is determined, and the determined value is stored in RAM 12. In step S6, the display pattern selected from those shown in FIG. 5 on the basis of the detected voltage difference is displayed as the residual voltage in the liquid crystal display portion 3.

In this embodiment, the residual battery voltage is detected by utilizing the battery consumption characteristics obtained when the EL backlight 4 is turned on and when it is turned off, i.e., by using a change in the voltage difference obtained from both states. However, in this invention, the voltage drop characteristics obtained under three or more types of power consumption conditions by the functioning portion may also be utilized. Alternately, the residual battery voltage may be detected and displayed using the voltage difference similarly obtained on the basis of both the power consumption when another functioning portion other than the EL backlight, e.g., a printer portion, is driven and the power consumption when the printer portion is not driven.

The battery is not limited to a nickel-cadmium battery. Any battery can be used so long as it can maintain a stable voltage during discharge. A battery other than a secondary battery can also be employed.

As will be understood from the foregoing description, the portable electronic apparatus according to the present invention includes a voltage detection component for detecting a battery voltage, a determination component for determining a difference between the battery voltages detected by the voltage detection means in different states of the functioning unit, and a component for determining and displaying a residual amount of the battery from the operated battery voltage difference. Thus, the portable electronic apparatus according to the present invention of small size, inexpensive and is capable of readily detecting the residual amount of a battery without requiring incorporation of a special part.

What is claimed is:

1. An electronic apparatus having a unit operated by a battery, said unit comprising an information processing portion and a display portion for displaying information processed by said information processing portion and said unit having at least first and second operating states, said first operating state being one in which said battery outputs a first amount of power to operate said information processing portion and said second operating state being one in which said battery outputs a second amount of power to operate both said information processing portion and said display portion, said first and second amounts of power each varying over time as said battery ages, said apparatus comprising:

voltage detection means for detecting a voltage of said battery with said unit in said first operating state and again with said unit in said second operating state;

means for determining a residual amount of the battery voltage on the basis of the battery voltage detected by said voltage detection means; and a CPU arranged to control, at selected times, said voltage detection means to operate during each of said operating states.

2. The electronic apparatus according to claim 1, further comprising indicating means for indicating a result of determination by said determination means.

3. The electronic apparatus according to claim 1, further comprising A/D conversion means for converting a result of detection of said voltage detection means.

4. The electronic apparatus according to claim 3, further comprising table storage means for storing a table of data to which digital data obtained by said A/D conversion means is compared.

5. An electronic apparatus having a main unit operated by a battery, said main unit including a first unit for inputting data, a second unit for displaying the input data and a third unit for printing the displayed data, and said main unit having at least first and second operating states, said first operating state being one in which said battery outputs a first amount of power to operate said main unit without at least one of said first, second and third units and said second operating state being one in which said battery outputs a second amount of power to operate said main unit together with said at least one of said first, second and third units, said first and second amounts of power each varying over time as said battery ages, said apparatus comprising:

voltage detection means for detecting a voltage of said battery with said unit in said first operating state and again with said unit in said second operating state;

means for determining a battery voltage difference on the basis of the battery voltages detected by said voltage detection means;

means for calculating the residual amount of said battery voltage based upon a determination of said determining means;

informing means for informing a user of a residual amount of said battery voltage on the basis of determination of said calculating means; and a CPU arranged to control, at selected times, said voltage detection means to operate during each of said operating states.

6. The electronic apparatus according to claim 5, further comprising A/D conversion means for converting a result of the detection of said voltage detection means.

7. The electronic apparatus according to claim 6, further comprising table storage means for storing a table of data to which digital data obtained by said A/D conversion means is compared.

8. A method of detecting a residual amount of battery voltage in an electronic apparatus having a unit operated by said battery, said unit comprising a unit for inputting data, a unit for displaying the input data and a unit for printing the displayed data, and the unit having at least first and second operating states, the first operating state being one in which the battery outputs a first amount of power to operate said unit for inputting data and the second operating state being one in which the battery outputs a second amount of power to operate said unit for inputting data and at least one of said unit for displaying the input data and said unit for printing the displayed data, the first and second amounts of power each varying over time as the battery ages, said method comprising the steps of:

operating a CPU to detect a battery voltage with the unit in the first operating state and again with the unit in the second operating state; and determining the residual amount of the battery voltage on the basis of the detected battery voltages.

9. A method of detecting a residual amount of battery voltage in an electronic apparatus having a unit operated by said battery, said unit including a display means for displaying information processed by said electronic apparatus and a light source arranged facing said display means, and the unit having at least first and second operating states, the first operating state being one in which the battery outputs a first amount of power to operate said unit without at least one of said display means and said light source and the second operating state being one in which the battery outputs a second amount of power to operate said unit together with at least one of said display means and said light source, the first and second amounts of power each varying over time as the battery ages, said method comprising the steps of:

operating a CPU to detect a battery voltage with the unit in the first operating state;

storing the detected first state battery voltage;

detecting the battery voltage with the unit in the second operating state;

storing the detected second battery voltage; and determining the residual amount of the battery voltage on the basis of the stored first and second state battery voltages.

10. The method of detecting a residual amount of a battery voltage according to claim 9, further comprising the step of indicating the residual amount of the battery voltage on the basis of a result of the determination.

11. A method of detecting a residual amount of a battery voltage in an electronic apparatus having a main unit operated by said battery, said main unit including a first unit for inputting data, a second unit for displaying the input data and a third unit for printing the displayed data, said method comprising the steps of:

putting said main unit in a first state in which said battery supplies power to operate said main unit without supplying power to at least one of said first, second and third units;

detecting a battery voltage in said first state of said unit;

operating a CPU to put said main unit in a second state in which said battery supplies power to operate said main unit together with said at least one of said first, second and third units;

detecting the battery voltage in said second state of said unit; and determining the residual amount of the battery voltages detected in said first and second states.

12. The method of detecting a residual amount of a battery voltage according to claim 11, further comprising the step of indicating the residual amount of battery voltage on the basis of the result of the determination.

13. An electronic apparatus having a unit operated by a battery, said unit including a display means for displaying information processed by said electronic apparatus and a light source arranged facing said display means, and said unit having at least first and second operating states, said first operating state being one in which said battery outputs a first amount of power to operate said unit without at least one of said means for displaying information and said light source and said second operating state being one in which said battery outputs a second amount of power to operate said unit together with said at least one of said means for displaying information and said light source, said first and second amounts of power each varying over time as said battery ages, said apparatus comprising:

manual operation means;

voltage detecting means, including a CPU, for detecting a voltage of said battery in response to an operation of said manual operation means; and means for determining a residual amount of said battery voltage on the basis of the battery voltages detected by said voltage detection means with said unit in said first operating state and again with said unit in said second operating state.

14. The electronic apparatus according to claim 13, further comprising A/D conversion means for converting a result of detection of said voltage detection means.

15. The electronic apparatus according to claim 13, further comprising table storage means for storing a table of data to which digital data obtained from said A/D conversion means is compared.

16. An electronic apparatus having a main unit operated by a battery, said main unit including a first unit for inputting data, a second unit for displaying the input data and a third unit for printing the displayed data, said main unit having at least first and second operating states, said first operating state being one in which said battery outputs a first amount of power to operate said main unit without at least one of said first, second and third units and said second operating state being one in which said battery outputs a second amount of power to operate said main unit together with said at least one of said first, second and third units, said first and second amounts of power each varying over time as said battery ages, said apparatus comprising:

a manually operated switch;

means, including a CPU, for operating said units responsive to operation of said manually operated switch;

voltage detecting means for detecting a voltage of said battery in response to an operation of said manually operated switch; and a circuit for determining a residual amount of the battery voltage on the basis of the battery voltages detected by said voltage detection means with said unit in said first operating state and again with said unit in said second operating state.

17. The electronic apparatus according to claim 16, further comprising A/D conversion means for converting a result of the detection of said voltage detection means.

18. The electronic apparatus according to claim 16, further comprising table storage means for storing a table of data to which detected data obtained from said A/D conversion means is compared.

19. An electronic apparatus being operated by a power supply from a power source, comprising:

input means for inputting information;

storage means for storing the information;

display means for displaying the information stored by said storing means;

illumination means for illuminating said display means;

instruction output means, arranged in said input means, for inputting an instruction to measure a residual amount of the power source;

detection means for detecting a voltage of the power source;

illumination control means for controlling said illumination means to illuminate in response to the instruction input by said instruction input means;

first detection control means for detecting the voltage of the power source during operation of said electronic apparatus when said illumination means has been controlled to illuminate by said illumination control means;

first detected voltage storage means for storing the voltage detected by said first detection control means;

second detection control means for detecting for detecting the voltage of the power source during operation of said electronic apparatus when said illumination means has gone out after illuminating;

second detected voltage storage means for storing the voltage detected by said second detection control means; and display control means for controlling so as to display the residual amount of the power source by calculating a difference between said first detected voltage storage means and said second detected voltage storage means, said instruction output means and said first and second detection control means being arranged to be controlled by a CPU.

20. An electronic apparatus according to claim 19, wherein said illumination means is a backlight of said display means.

21. An electronic apparatus according to claim 19, wherein said display control means comprises a standard memory having a standard voltage and compares the detected voltage with the standard voltage.

22. An electronic apparatus being operated by a power supply from a power source, comprising:

input means for inputting information;

storage means for storing the information;

display means for displaying the information stored by said storage means;

illumination means for illuminating said display means;

an instruction input device, being arranged in said input means, for inputting an instruction to measure a residual amount of the power source;

a drive control device for controlling at least one of said means to operate in response to the instruction input by said instruction input device;

a first detection control device for detecting the voltage of the power source when operation of a plurality of said means has been controlled by said drive control device;

a first detected voltage storage device for storing the voltage detected by said first detection control device;

a second detection control device for detecting the voltage of the power source when driving some of said plurality of means has been stopped;

a second detected voltage storage device for storing the voltage detected by said second detection control device, said first and second instruction control devices being arranged to be controlled by a CPU; and a display control device for controlling said display device to display the residual amount of the power source by calculating a difference between said first detected voltage storage means and said second detected voltage storage means.

23. An electronic apparatus according to claim 22, wherein said illumination means is a backlight.

24. An electronic apparatus being operated by a power supply from a power source, comprising:

input means for inputting information;

storage means for storing the information;

display means for displaying the information stored by said storage means;

illumination means for illuminating said display means;

a characteristic memory for storing characteristics of the power source;

an instruction input device, being arranged in said input means, for inputting an instruction to measure a residual amount of the power source;

a detection device for detecting a voltage of the power source;

a drive control device for controlling some of said means to drive in response to the instruction input by said instruction input device;

a first detection control device for detecting the voltage of the power source when driving of some of said means has been controlled by said drive control device;

a first detected voltage storage device for storing the voltage detected by said first detection control device;

a second detection control device for detecting the voltage of the power source when driving of some of said means has been stopped;

said first and second detection devices being arranged to be controlled by a CPU;

a second detected voltage storage device for storing the voltage detected by said second detection control device; and a display control device for referring to said characteristic memory and controlling said display means to display the residual amount of the power source in accordance with the detected voltage stored by said first and second detected voltage storage device.

* * * * *

UNITED STATES PATENT AND TRADEMARK OFFICE
CERTIFICATE OF CORRECTION

PATENT NO. : 5,784,295

DATED : July 21, 1998

INVENTOR(S): MAKOTO HINOHARA

It is certified that error appears in the above-identified patent and that said Letters Patent is hereby corrected as shown below:

COLUMN 4
Line 17, "battery 7;" should read --battery 7.--;
Line 42, "CVD" should read --$C_{VD}$--;
Line 66, "FIGS. 5(A)." should read --FIG. 5(A).--.

COLUMN 5
Line 7, "button," should read --button 16 which operates a manually operated switch 17,--.

COLUMN 9
Line 3, "for detecting" (second occurrence) should be deleted;
Line 9, "means; and" should read --means;--;
Line 13, "means," should read --means; and--.

Signed and Sealed this

First Day of June, 1999

Attest:

Q. TODD DICKINSON

*Attesting Officer*   *Acting Commissioner of Patents and Trademarks*